US010734945B1

(12) United States Patent
Kim et al.

(10) Patent No.: US 10,734,945 B1
(45) Date of Patent: Aug. 4, 2020

(54) POTENTIAL INDUCED DEGRADATION TEST APPARATUS FOR SOLAR CELL AND THE METHOD THEREOF

(71) Applicant: GUMI ELECTRONICS & INFORMATION TECHNOLOGY RESEARCH INSTITUTE, Gumi-si, Gyeongsangbuk-do (KR)

(72) Inventors: Soo Min Kim, Gumi-si (KR); Jun Hee Kim, Gumi-si (KR); Sang Hoon Jung, Gumi-si (KR)

(73) Assignee: GUMI ELECTRONICS & INFORMATION TECHNOLOGY RESEARCH INSTITUTE, Gumi-si (KR)

(*) Notice: Subject to any disclaimer, the term of this patent is extended or adjusted under 35 U.S.C. 154(b) by 0 days.

(21) Appl. No.: 16/689,722

(22) Filed: Nov. 20, 2019

(51) Int. Cl.
*G01R 31/26* (2020.01)
*H02S 50/10* (2014.01)
*H01L 31/048* (2014.01)
*H02S 40/30* (2014.01)

(52) U.S. Cl.
CPC ............ *H02S 50/10* (2014.12); *H01L 31/048* (2013.01); *H02S 40/30* (2014.12)

(58) Field of Classification Search
CPC ........... H01L 31/0481; H01L 31/02168; H01L 31/02167; H01L 31/048; H01L 2251/5338; H01L 31/022425; H01L 31/022441; H01L 31/02021; H01L 31/0445; H01L 31/06; G01N 21/6454; G01N 2201/0245; G01N 2021/7786; G01N 21/6428; G01N 2201/062; G01N 2201/12; G01N 21/6489; G01N 21/66; G01N 33/00

See application file for complete search history.

(56) References Cited

U.S. PATENT DOCUMENTS

| | | | | |
|---|---|---|---|---|
| 7,847,237 | B2* | 12/2010 | Fuyuki | H02S 50/10 250/214 R |
| 8,476,914 | B2* | 7/2013 | Ko | H02S 50/10 324/500 |
| 8,860,424 | B1* | 10/2014 | Lamarche | H02S 50/10 165/61 |
| 9,506,975 | B2* | 11/2016 | Nagel | G01R 31/129 |

FOREIGN PATENT DOCUMENTS

KR  10-2018-0001832 A  1/2018
KR     10-2000984 B1  7/2019

* cited by examiner

*Primary Examiner* — Vinh P Nguyen
(74) *Attorney, Agent, or Firm* — Novick, Kim & Lee, PLLC; Jae Youn Kim

(57) ABSTRACT

A potential induced degradation test apparatus for a solar cell includes a PID test chamber (101), a mounting unit (110), one or more PID supply means of a PID test sheet (120) or a PID-causing substance supply unit (140), a heating unit (130), a voltage applying unit (150), and a PID measuring unit (160). The potential induced degradation test apparatus is capable of quantifying a level of a cell and durability against PID of individual configurational members such as an encapsulant of a solar cell module by a method of directly applying solid Na and vaporized Na ions quantified by minimum cell unit in a method in which large-area modularization of the solar cell module is not performed.

15 Claims, 8 Drawing Sheets

POTENTIAL INDUCED DEGRADATION TEST APPARATUS FOR SOLAR CELL AND THE METHOD THEREOF

BACKGROUND OF THE INVENTION

Field of the Invention

The present invention relates to a test and analysis of a solar cell, and more specifically, a potential induced degradation test apparatus for a solar cell and a method thereof for detecting potential induced degradation (PID) of the solar cell.

Description of the Related Art

Currently, a potential induced degradation (PID) phenomenon frequently occurs, in which an output and efficiency of a solar cell module are rapidly reduced during an actual operation thereof in a plant built for generating solar power.

Na ions in glass used in a manufactured module are known as a main cause of the PID phenomenon, and thus PID is prevented from occurring by changing glass and an encapsulant in order to prevent the PID phenomenon. For example, instead of an encapsulant such as an ethylene-vinyl acetate (EVA) copolymer for a solar cell in the related art, a polyolefin-based material, especially, an ethylene-based material, is widely used because the material has a good insulating property.

In addition, in order to improve efficiency of solar power, there have been provided various PID detecting methods for detecting and taking a measure against the PID phenomenon.

An example of the above-described PID detecting methods which are widely used includes a method for detecting PID of a solar cell in which a photo voltaic cell (PV) module manufactured in accordance with IEC 62804 standards stays for 96 hours in a state where a voltage of 600 V to 1,000 V is applied to the PV module in an environment of a temperature of 70° C. to 85° C. and relative humidity (RH) of 85%.

However, the PID phenomenon of a solar cell occurs due to combined performance of a solar cell and all configurational elements such as an encapsulant, a back-sheet, a sealing material, and glass which configure the solar cell, and thus every configuration of the solar cell needs to be considered as a cause of the PID phenomenon; however, a method for evaluating PID of a solar cell in the related art described above is carried out by a method in which a photo voltaic cell (PV cell), a cell protecting encapsulant, and the like are simultaneously evaluated, and thus it is difficult to find a method for accurately correcting a cause of the PID.

CITATION LIST

Patent Literature

Patent Literature 1: Korean Patent Application Publication No. 10-2018-0001832
Patent Literature 2: Korean Patent No. 10-2000984

SUMMARY OF THE INVENTION

Hence, a technical object to be achieved by the present invention is to solve such problems of the related art described above and, thus, is to provide a potential induced degradation test apparatus for a solar cell and a method thereof by which it is possible to simplify a PID test procedure of the related art, possible to improve cost efficiency, and possible to significantly shorten a time taken for a PID test.

Another technical object to be achieved by the present invention is to provide a potential induced degradation test apparatus for a solar cell and a method thereof by which it is possible to test and detect PID from individual configurational members by separating a solar cell, an encapsulant, a back-sheet, a sealing material, glass, and the like, which configure a solar cell module, from each other or combined PID from coupled members of individual separate configurations, and thereby it is not only possible to reliably test PID from individual configurational members and an interaction between the individual configurational members, but also possible to quantify durability against a PID phenomenon due to the individual configurational members and the interaction between the individual configurational members.

In order to achieve the above-described technical object, there is provided a potential induced degradation test apparatus configured to include: a potential induced degradation (PID) test chamber; a mounting unit which is provided inside the PID test chamber and at which a solar cell unit as a PID test target is seated and then a PID test is carried out; any one PID supply means of a PID test sheet or a PID-causing substance supply unit, the PID test sheet being attached on a top of the solar cell unit so as to supply PID-causing substances to a solar cell of the solar cell unit and then being seated together with the solar cell unit at the mounting unit and the PID-causing substance supply unit supplying PID-causing substances into an inside of the PID test chamber; a heating unit which is formed below the mounting unit so as to heat the solar cell unit seated at the mounting unit for the PID test; a voltage applying unit which applies a PID test voltage to a top surface and an underside of the solar cell unit seated at the mounting unit; and a PID measuring unit which detects a current generated at the solar cell of the solar cell unit and then detects PID.

In this configuration, the mounting unit is configured of a lower support plate at which the solar cell unit is seated and which is formed by a conductive metal plate having a vacuum channel formed to have a vacuum pressure as an internal pressure, one or more vacuum holes formed to penetrate a top surface of the lower support plate at a position of the vacuum channel, and a vacuum tube which applies a negative pressure for vacuum to the vacuum channel.

In this configuration, the PID test sheet has a polymer resin layer and a PID-causing substance layer which comes into contact with a top surface of the solar cell unit and is formed to be stacked under an underside of the polymer resin layer so as to supply the PID-causing substances to the solar cell. In this configuration, a PID test for a case where the PID-causing substances are directly injected into the solar cell is carried out.

In this configuration, the PID test sheet has a polymer resin layer which comes into contact with a top surface of the solar cell unit and a PID-causing substance layer which is formed to be stacked on a top surface of the polymer resin layer so as to supply the PID-causing substances to the solar cell via the polymer resin layer. In this configuration, a PID test for a case where the PID-causing substances are injected into the solar cell via an encapsulant corresponding to the polymer resin layer.

In this configuration, the PID test sheet has a polymer resin layer which comes into contact with a top surface of the solar cell unit, and PID-causing substances which are injected into an inside of the polymer resin layer and move through the inside of the polymer resin layer so as to be injected into the solar cell. In this configuration, a PID test for a case where an encapsulant corresponding to the polymer resin layer is contaminated with the PID-causing substances.

The PID-causing substances are Na ions.

In this configuration, the PID-causing substance supply unit is configured of an Na vaporizer which vaporizes Na and supplies an Na gas into an inside of the PID test chamber.

In this configuration, the potential induced degradation test apparatus for a solar cell further includes a load unit that has weights and a weight fixing rod which has an upper voltage terminal formed at an upper side of the weight fixing rod and on which the weights are mounted.

In order to achieve the above-described technical object, there is provided a method of a potential induced degradation test for a solar cell which is carried out by a potential induced degradation test apparatus for a solar cell which is configured to include a potential induced degradation (PID) test chamber, a mounting unit, a heating unit, one or more PID supply means of a PID-causing substance supply unit or a PID test sheet, a voltage applying unit, and a PID measuring unit, the method including: a solar cell unit mounting step of mounting, on the mounting unit, a solar cell unit with the PID test sheet being attached to a top surface thereof or a solar cell unit to which the PID test sheet is not attached; a PID-causing substance injecting step of injecting, into a solar cell of the solar cell unit, a PID-causing substance gas supplied into an inside of the PID test chamber by applying a voltage to the mounting unit and vaporizing PID-causing substances in the PID test sheet or vaporizing PID-causing substances by the PID-causing substance supply unit; and a PID detecting step of detecting PID by measuring a leakage current of the solar cell unit to which a voltage is applied and into which the PID-causing substances are injected.

The solar cell unit mounted in the solar cell unit mounting step is any one of a solar cell or a coupled body of the solar cell and one or more of an encapsulant, a back-sheet, a sealing material, or glass.

The solar cell unit mounting step is a step of mounting the solar cell unit in which the mounting unit is formed by a conductive metal plate having a vacuum channel formed to have a vacuum pressure as an internal pressure in the lower support plate, one or more vacuum holes formed to penetrate a top surface of the lower support plate at a position of the vacuum channel, and a vacuum tube which applies a negative pressure for vacuum to the vacuum channel, so the solar cell unit comes into close contact with a top of the lower support plate by vacuum suction in order to improve a fixing force and conductivity.

In the PID-causing substance injecting step, the PID-causing substances injected into the solar cell are Na ions.

The PID-causing substance injecting step is a step of injecting the PID-causing substances into the solar cell by the PID test sheet having a polymer resin layer; and a PID-causing substance layer which comes into contact with a top surface of the solar cell unit and is formed to be stacked under an underside of the polymer resin layer so as to supply the PID-causing substances to the solar cell, in order to carry out a PID test for a case where the PID-causing substances are directly injected into the solar cell.

The PID-causing substance injecting step is a step of injecting the PID-causing substances into the solar cell by the PID test sheet having a polymer resin layer which comes into contact with a top surface of the solar cell unit; and a PID-causing substance layer which is formed to be stacked on a top surface of the polymer resin layer so as to supply the PID-causing substances to the solar cell via the polymer resin layer, in order to carry out a PID test for a case where the PID-causing substances are injected into the solar cell via an encapsulant corresponding to the polymer resin layer.

The PID-causing substance injecting step is a step of injecting the PID-causing substances into the solar cell by the PID test sheet having a polymer resin layer which comes into contact with a top surface of the solar cell unit; and PID-causing substances which are dispersed and injected into an inside of the polymer resin layer such that the PID-causing substances are supplied to the solar cell via the polymer resin layer, in order to carry out a PID test for a case where an encapsulant corresponding to the polymer resin layer is contaminated with the PID-causing substances.

Advantageous Effects of Invention

The present invention has effects in that it is possible to simplify a PID test procedure of the related art, possible to improve cost efficiency, and possible to significantly shorten a time taken for a PID test.

In addition, the present invention has effects in that it is possible to test and detect PID from individual configurational members by separating a solar cell, an encapsulant, a back-sheet, a sealing material, glass, and the like, which configure a solar cell module, from each other or combined PID from coupled members of individual separating configurations, and thereby it is not only possible to reliably test PID from individual configurational members and an interaction between the individual configurational members, but also possible to quantify durability against a PID phenomenon due to the individual configurational members and the interaction between the individual configurational members.

Effects of the present invention need to be construed not to be limited to the above-mentioned effects but to include every effect that can be derived from configurations of the invention described in the detailed description and claims of the present invention.

DETAILED DESCRIPTION OF THE PREFERRED EMBODIMENTS

Hereinafter, the present invention will be described with reference to the accompanying drawings. However, the invention can be realized as various different examples and, thus, is not limited to embodiments described here. Besides, a part irrelevant to the description is omitted from the drawings in order to clearly describe the present invention, and similar reference signs are assigned to similar parts through the entire specification.

In the entire specification, a case where a certain part is "connected to (access, in contact with, or coupled to)" another part includes not only a case where the parts are "directly connected" to each other, but also a case where the parts are "indirectly connected" to each other with another member interposed therebetween. In addition, when a certain part "includes" a certain configurational element, this means that another configurational element is not excluded but the configurational element can be further included, unless specifically described otherwise.

Terms used in this specification are only used to describe a specific embodiment and are not intentionally used to limit the invention thereto. A singular form includes a plural form, unless obviously implied otherwise in context. In this specification, a term such as "to include" or "to have" needs to be construed to specify that a feature, a number, a step, an operation, a configurational element, a part, or an assembly thereof described in the specification is present and not to exclude presence or a possibility of addition of one or more other features, numbers, steps, operations, configurational elements, parts, or assemblies thereof in advance.

Hereinafter, embodiments of the invention will be described in detail with reference to the accompanying drawings.

Figure 1:
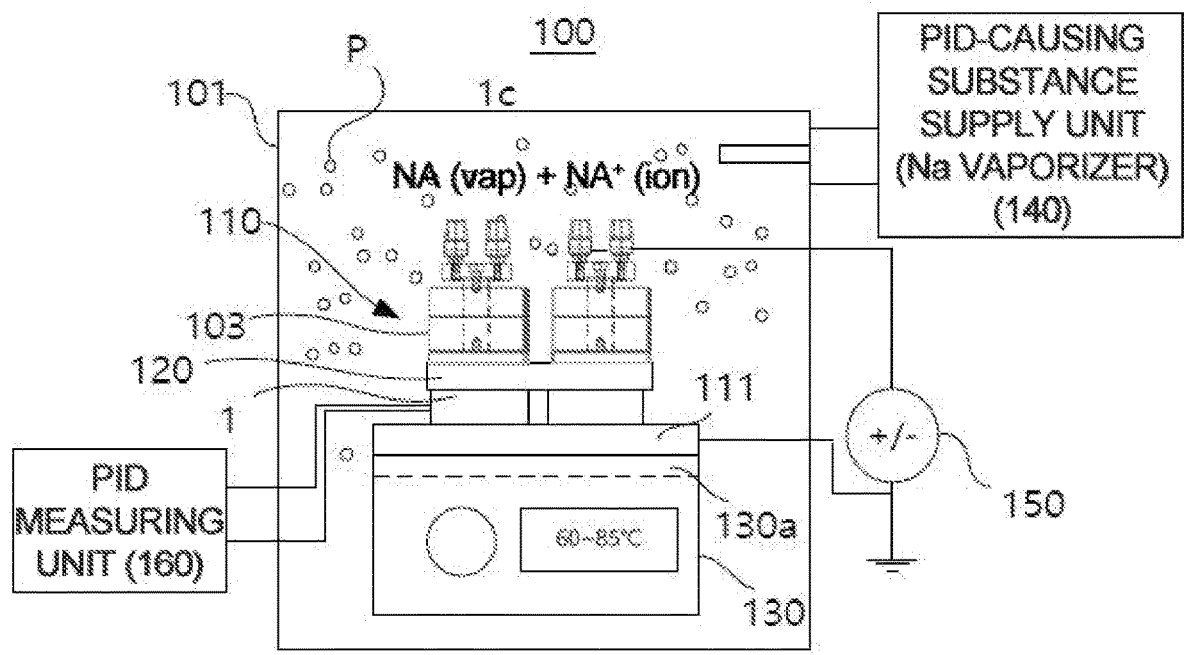
FIG. 1 is a block diagram of a potential induced degradation test apparatus 100 according to an embodiment of the present invention.
Figure 2:
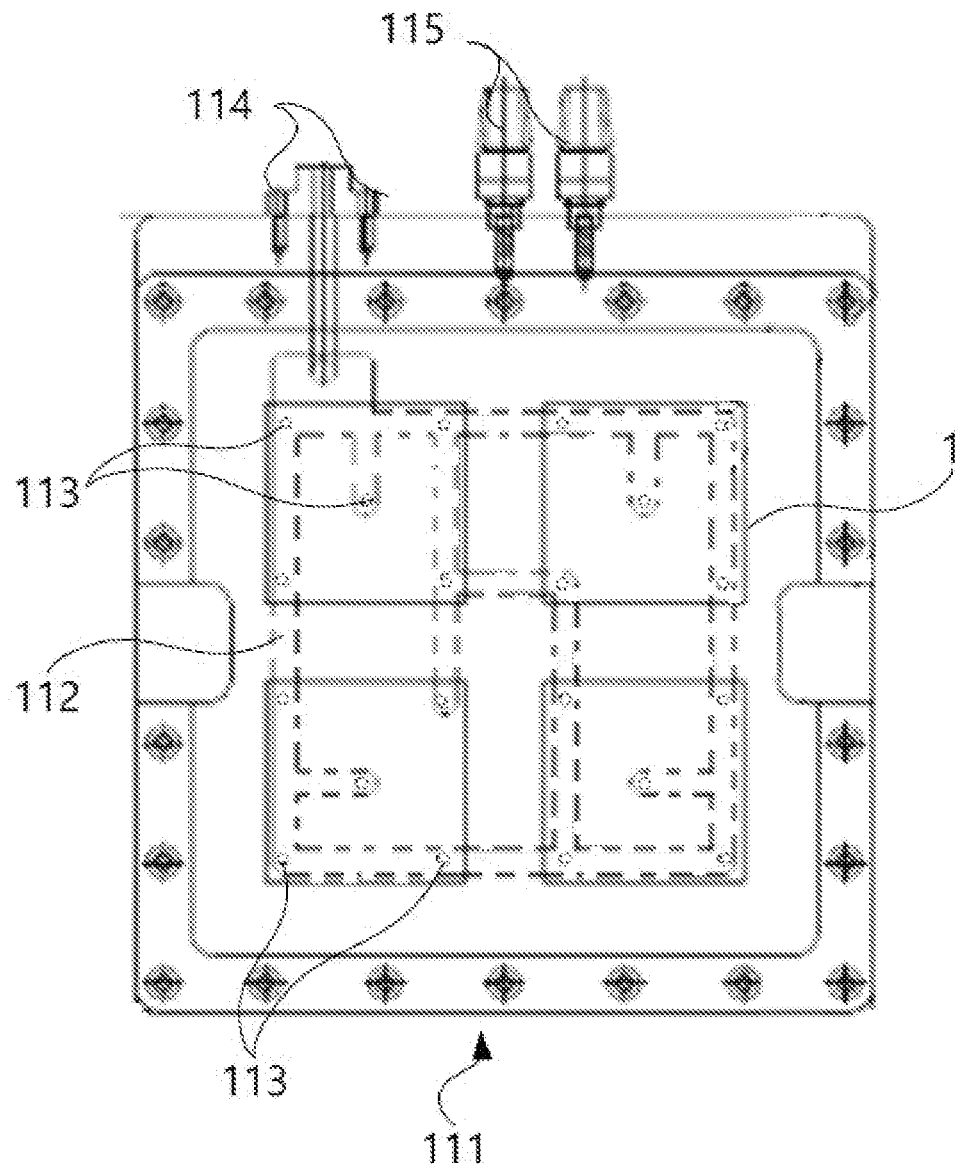
FIG. 2 is a detailed block diagram of a lower support plate 111.
Figure 3A:
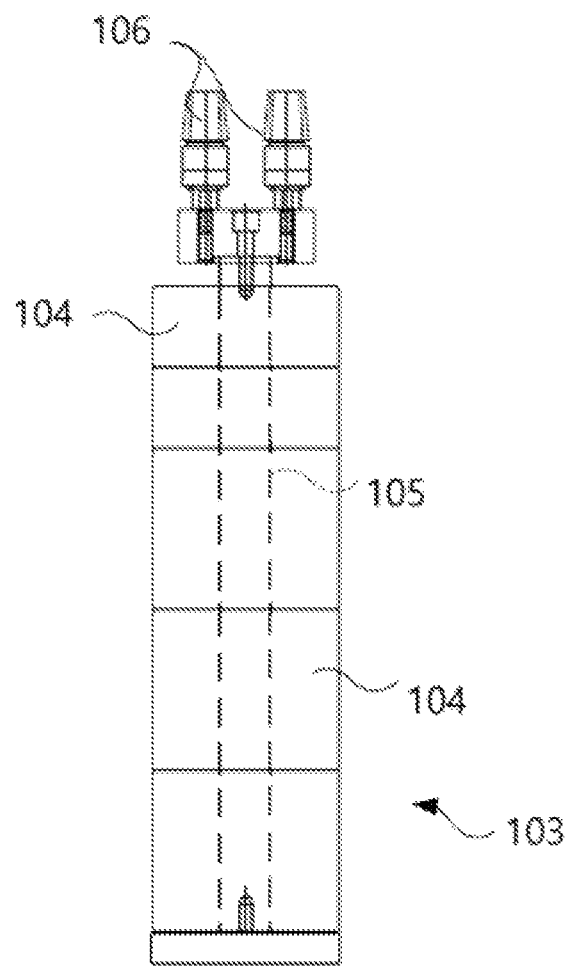
FIG. 3A shows a side view of a load unit 103 and FIG. 3B shows a plan view of a weight 104.
Figure 3B:
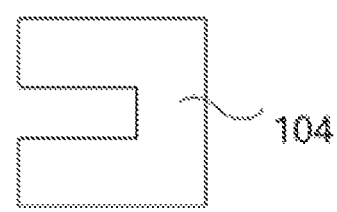

FIG. 1 is a block diagram of a potential induced degradation test apparatus 100 according to an embodiment of the present invention. FIG. 2 is a detailed block diagram of a lower support plate 111. FIG. 3A shows a side view a load unit 103 and FIG. 3B shows a plan view of a weight 104.

As shown in FIG. 1, a potential induced degradation test apparatus 100 for a solar cell according to an embodiment of the present invention is configured to include: a potential induced degradation (PID) test chamber 101; a mounting unit 110 which is provided inside the PID test chamber 101 and at which a solar cell unit 1 as a PID test target is seated and then a PID test is carried out; a heating unit 130 which is formed below the mounting unit 110 so as to heat the solar cell unit 1 seated at the mounting unit 110 for the PID test; any one PID supply means of a PID test sheet 120 or a PID-causing substance supply unit 140, the PID test sheet being attached on a top of the solar cell unit so as to supply PID-causing substances to a solar cell of the solar cell unit and then being seated together with the solar cell unit at the mounting unit and the PID-causing substance supply unit supplying PID-causing substances into an inside of the PID test chamber; a voltage applying unit 150 which applies a PID test voltage to a top surface and an underside of the solar cell unit 1 seated at the mounting unit 110; and a PID measuring unit 160 which detects a leakage current from the solar cell of the solar cell unit 1 and then detects PID.

In the above-described configuration, the PID-causing substances can be Na ions.

Besides, the solar cell unit 1 is configured of any one a solar cell or a coupled body of the solar cell and one or more of an encapsulant, a back-sheet, a sealing material, or glass, thereby, having a configuration in which the encapsulant and individual glass configurational members are independent from or coupled to each other from a unit of a cell, and thus it is possible to carry out a PID test in a state where the encapsulant and the individual glass configurational members are independent from each other or are coupled to each other from the unit of the cell by adjusting an amount of Na depending on individual structures.

As shown in FIG. 2, the mounting unit 110 is configured of a lower support plate at which the solar cell unit is seated and which is formed by a conductive metal plate having a vacuum channel 112 formed to have a vacuum pressure as an internal pressure, one or more vacuum holes 113 formed to penetrate a top surface of the lower support plate at a position of the vacuum channel 112, and a vacuum tube 114 which applies a negative pressure for vacuum to the vacuum channel 112.

In addition, the mounting unit 110 can be configured to further include a lower voltage terminal 115 which applies a voltage to the solar cell unit 1.

In the above-described configuration of the mounting unit 110, the lower support plate 111 can be manufactured by a Cu metal plate that reduces a temperature loss to a minimum extent and has high heat and electron transfer rates, in order to obtain a constant result of the PID test.

One or more solar cell units 1 or one solar cell unit having an area corresponding to a mounting area of the mounting unit 110 can be mounted on the mounting unit 110 having the above-described configuration such that the PID test can proceed. In addition, vacuum-suction of an underside of the solar cell unit 1 can increase a constant surface joining rate between conductive metal materials of the underside of the solar cell unit 1 and increase an ohmic-contact rate, thereby, increasing reliability of the PID test.

In addition, the potential induced degradation test apparatus 100 for a solar cell according to an embodiment of the present invention can be configured to further include a load unit 103 configured of weights having variable conductivity so as to increase a contact force between the solar cell unit 1 and the lower support plate 111 which is a conductive metal block.

As shown in FIGS. 3A and 3B, the load unit 103 can be configured to include the weights 103 and a weight fixing rod 105 which has an upper voltage terminal 106 formed at an upper side thereof and on which the weights 103 are mounted.

As shown in FIG. 3B, the weights 104 are formed into a U shape to have various weights by unit of g or unit of kg and are coupled to the weight fixing rod 105 in accordance with a loading condition. In this case, the weight 104 can be formed to have an area corresponding to the solar cell unit 1.

As described above, the load unit 103 configured to have the weights 104 and the weight fixing rod 105 which are coupled to each other is seated on the PID test sheet 120 or a top of the solar cell unit 1 and applies a load to the solar cell unit 1, thereby, performing a function of increasing a close-contact force between the solar cell unit 1 and the lower support plate 111 and preventing the solar cell unit and the lower support plate from being broken.

Figure 4:
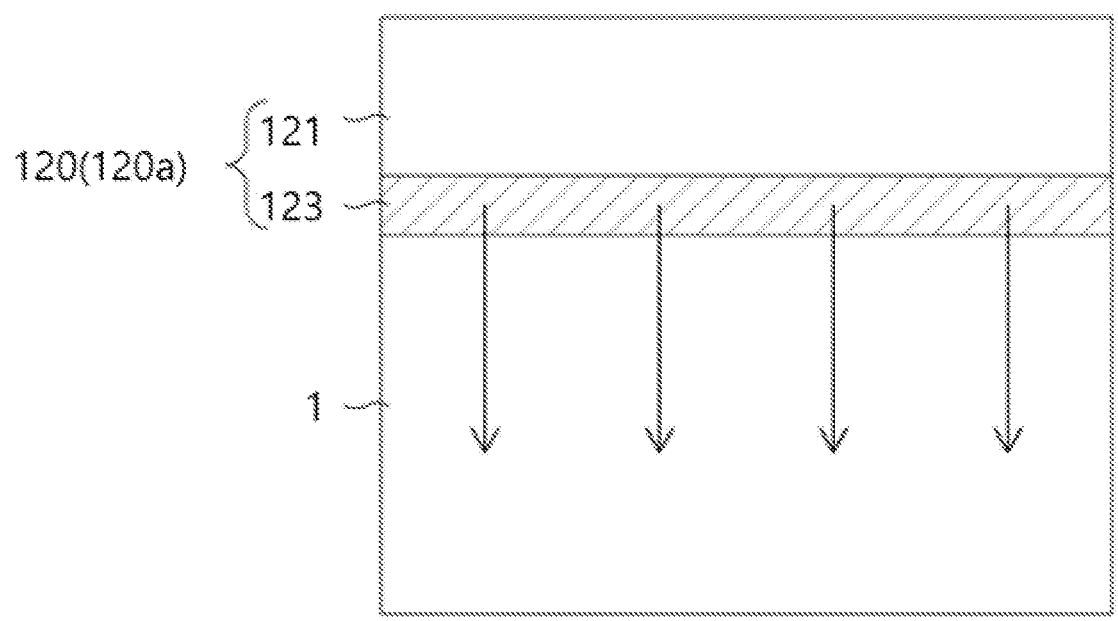
FIG. 4 is a cross-sectional view of a PID test sheet 120a having a PID-causing substance layer 123 formed under an underside of a polymer resin layer 121.
Figure 5:
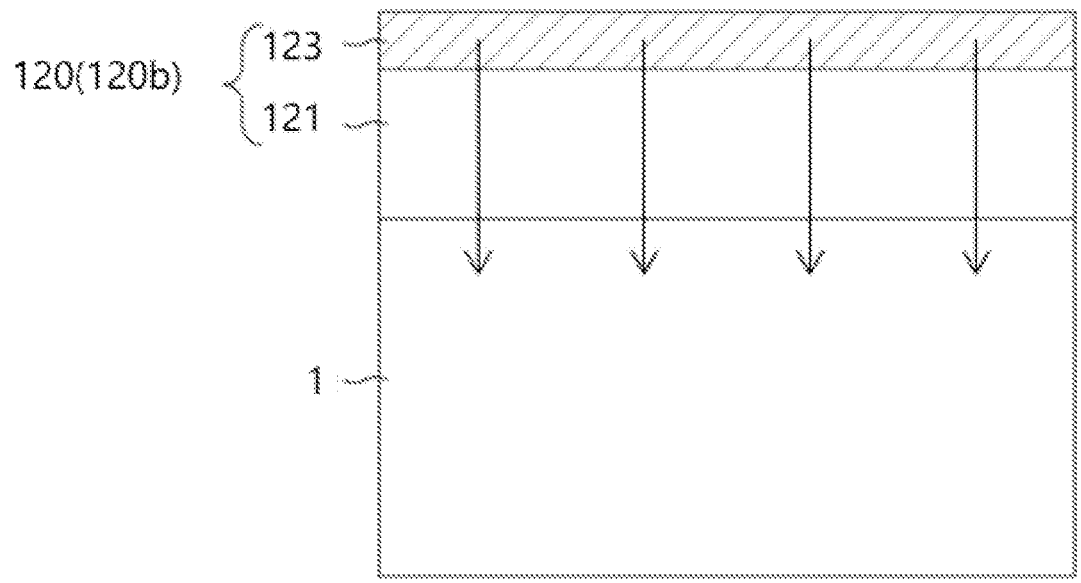
FIG. 5 is a cross-sectional view of a PID test sheet 120b having the PID-causing substance layer 123 formed on a top surface of the polymer resin layer 121.
Figure 6:
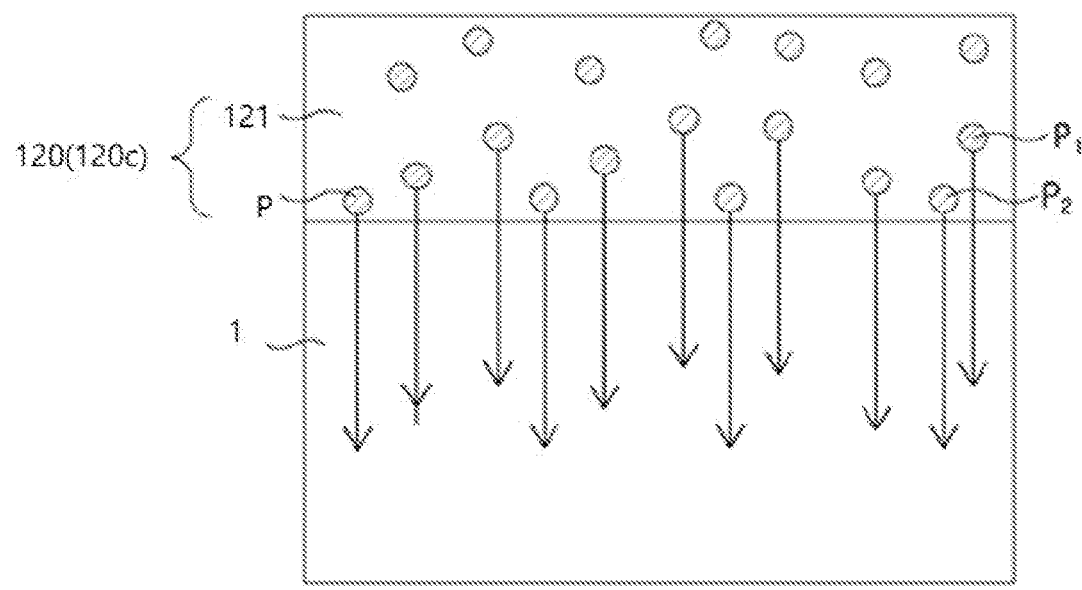
FIG. 6 is a cross-sectional view of a PID test sheet 120c formed by injecting PID-causing substances P, P1, and P2 into an inside of the polymer resin layer 121.

The PID test sheet 120 is configured into a sheet shape in various structures having the PID-causing substances, as shown in FIGS. 4 to 6, so as to supply solid PID-causing substances to a solar cell (not shown) provided in the solar cell unit 1.

Specifically, FIG. 4 is a cross-sectional view of a PID test sheet 120a having a PID-causing substance layer 123 formed under an underside of a polymer resin layer 121, FIG. 5 is a cross-sectional view of a PID test sheet 120b having the PID-causing substance layer 123 formed on a top surface of the polymer resin layer 121, and FIG. 6 is a cross-sectional view of a PID test sheet 120c formed by injecting PID-causing substances P, P1, and P2 into an inside of the polymer resin layer 121.

As shown in FIG. 4, the PID test sheet 120a is configured to have the polymer resin layer 121 and the PID-causing substance layer 123 which comes into contact with a top surface of the solar cell unit 1 and is formed to be stacked under the underside of the polymer resin layer 121 so as to supply the PID-causing substance P to the solar cell. The PID test sheet 120a having the above-described configuration is attached to the top of the solar cell unit 1 and is mounted on the mounting unit 110. In this manner, when a voltage is applied from outside, the solid PID-causing substance P is directly injected into an inside of the solar cell of the solar cell unit 1. Consequently, the PID test sheet 120a is provided to carry out a PID test for a case where the solid PID-causing substance P is directly injected into the solar cell.

In contrast, as shown in FIG. 5, the PID test sheet 120b can be configured to have the polymer resin layer 121 which comes into contact with the top surface of the solar cell unit 1 and the PID-causing substance layer 123 which is formed to be stacked on the top surface of the polymer resin layer 121 so as to supply the PID-causing substance P to the solar cell via the polymer resin layer. In this case, when a voltage is applied from outside, the PID test sheet 120b having the above-described configuration is attached to the top of the solar cell unit 1 and is mounted on the mounting unit 110, and thereby the solid PID-causing substance P is injected into the solar cell through the polymer resin layer 121. Consequently, the PID test sheet 120b is provided to carry out a PID test for a case where the PID-causing substance P is injected into the solar cell via an encapsulant corresponding to the polymer resin layer 121.

In addition, as shown in FIG. 6, the PID test sheet 120c can be configured to have the polymer resin layer 121 which comes into contact with the top surface of the solar cell unit 1 and the PID-causing substances P which are injected into an inside of the polymer resin layer 121 and moves through the inside of the polymer resin layer so as to be injected into the solar cell. In this case, when a voltage is applied from outside, the solid PID-causing substances P injected into the inside of the polymer resin layer 121 pass through the polymer resin layer 121 and is injected into the inside of the solar cell of the solar cell unit 1. Consequently, the PID test sheet 120c is provided to carry out a PID test for a case where the encapsulant corresponding to the polymer resin layer is contaminated with the PID-causing substances.

To be described with reference to FIG. 1 again, the heating unit 130 is configured to have a hot plate 130a at a top thereof and is configured to perform heating at 60 to 85° C. so as to heat the lower support plate 111 for the PID test.

The PID-causing substance supply unit 140 is configured to vaporize the PID-causing substances and then to adjust an amount thereof and to supply the PID-causing substance into an inside of the PID test chamber 101, depending on a purpose of the PID test. In this case, the PID-causing substances vaporized to be supplied can be Na gas or Na ions.

The voltage applying unit 150 is configured to apply a voltage for the PID test to the upper voltage terminal 106 of the load unit 103 and the lower voltage terminal 115 of the lower support plate 111, after the solar cell unit 1 is mounted on the mounting unit 110. The voltage causes the PID-causing substances such as Na ions to be injected into the solar cell provided in the solar cell unit 1 and causes PID.

The PID measuring unit 160 is configured to analyze the PID, after measuring a PID analyzing signal of a leakage current or a current-voltage or electric power output from the solar cell unit 1 contaminated with the PID-causing substances by simulation of a contaminated state with the PID-causing substances.

The potential induced degradation test apparatus 100 for a solar cell which has the above-described configuration can be configured to include any one of the PID test sheet 120 or the PID-causing substance supply unit 140.

In addition, the potential induced degradation test apparatus 100 for a solar cell can be configured to include both the PID test sheet 120 and the PID-causing substance supply unit 140. In this case, the potential induced degradation test apparatus 100 for a solar cell is capable of quantifying a level of a cell and durability against the PID of individual configurational members such as an encapsulant of a solar cell module by a method of directly applying solid Na and vaporized Na ions quantified by minimum cell unit in a method in which large-area modularization is not performed.

Figure 7:
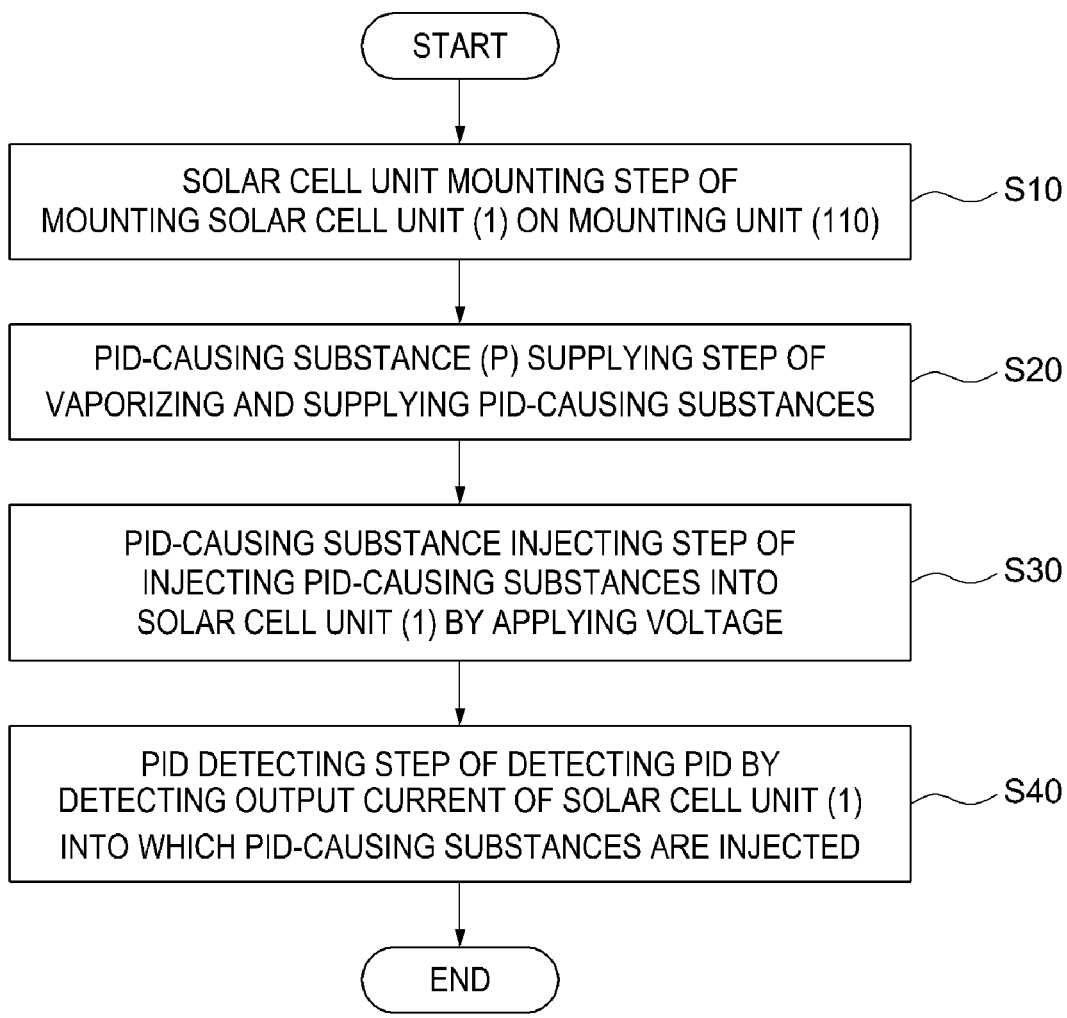
FIG. 7 is a flowchart showing a processing procedure of a method of a PID test which is carried out by supplying PID-causing substances by a PID-causing substance supply unit 140 in an embodiment, according to the present invention.

FIG. 7 is a flowchart showing a processing procedure of a method of a PID test which is carried out by supplying the PID-causing substances by the PID-causing substance supply unit 140 in an embodiment, according to the present invention.

As shown in FIG. 7, the method of a PID test carried out by supplying the PID-causing substances by the PID-causing substance supply unit 140 is performed by the potential induced degradation test apparatus for a solar cell which is configured to include the PID test chamber 101, the mounting unit 110, the PID supply means, the heating unit 130, the voltage applying unit 150, and the PID measuring unit 160, and the method can be configured to include a solar cell unit mounting step S10, a PID-causing substance supplying step S20, a PID-causing substance injecting step S30, and a PID detecting step S40.

Of the steps, in the solar cell unit mounting step S10, the solar cell unit 1 is mounted at a top of the lower support plate 111, the solar cell unit being configured of any one of a solar cell or a coupled body of the solar cell and one or more of an encapsulant, a back-sheet, a sealing material, or glass. Besides, the load unit 103 for applying a load is mounted at a top of the solar cell unit 1 or the PID test sheet 120. Subsequently, a vacuum negative pressure by the vacuum channel 112, the vacuum holes 113, and the vacuum tube 114 formed in the lower support plate 111 causes the underside of the solar cell unit 1 to come into vacuum-suction contact with the top surface of the lower support plate 111 so as to achieve ohmic contact therebetween.

Next, in the PID-causing substance supplying step S20, the PID-causing substance supply unit 140 vaporizes and gasifies the PID-causing substances such as Na and then supplies the PID-causing substances into the inside of the PID test chamber 101.

Subsequently, in the PID-causing substance injecting step S30, the voltage applying unit 150 applies a voltage for the PID test to the upper voltage terminal 106 of the load unit 103 and the lower voltage terminal 115 of the lower support plate 111 of the mounting unit 110 such that the PID-causing substances are guided to be injected into the inside of the solar cell.

Subsequently, in the PID detecting step S40, the PID measuring unit 160 analyzes the PID, after measuring the PID analyzing signal of a leakage current or a current-voltage or electric power output from the solar cell unit 1 contaminated with the PID-causing substances by a simulation of a contaminated state with the PID-causing substances.

The method of a PID test for a solar cell in FIG. 7 described above has the following technical features. The solar cell unit is configured of any one of a solar cell or a coupled body of the solar cell and one or more of an encapsulant, a back-sheet, a sealing material, or glass, thereby, having a configuration in which the encapsulant and individual glass configurational members are independent from or coupled to each other from a unit of a cell, and thus it is possible to carry out the PID test by using gaseous PID-causing substances in a state where the encapsulant and the individual glass configurational members are independent from or are coupled to each other from the unit of the cell by adjusting an amount of Na depending on individual structures.

Figure 8:
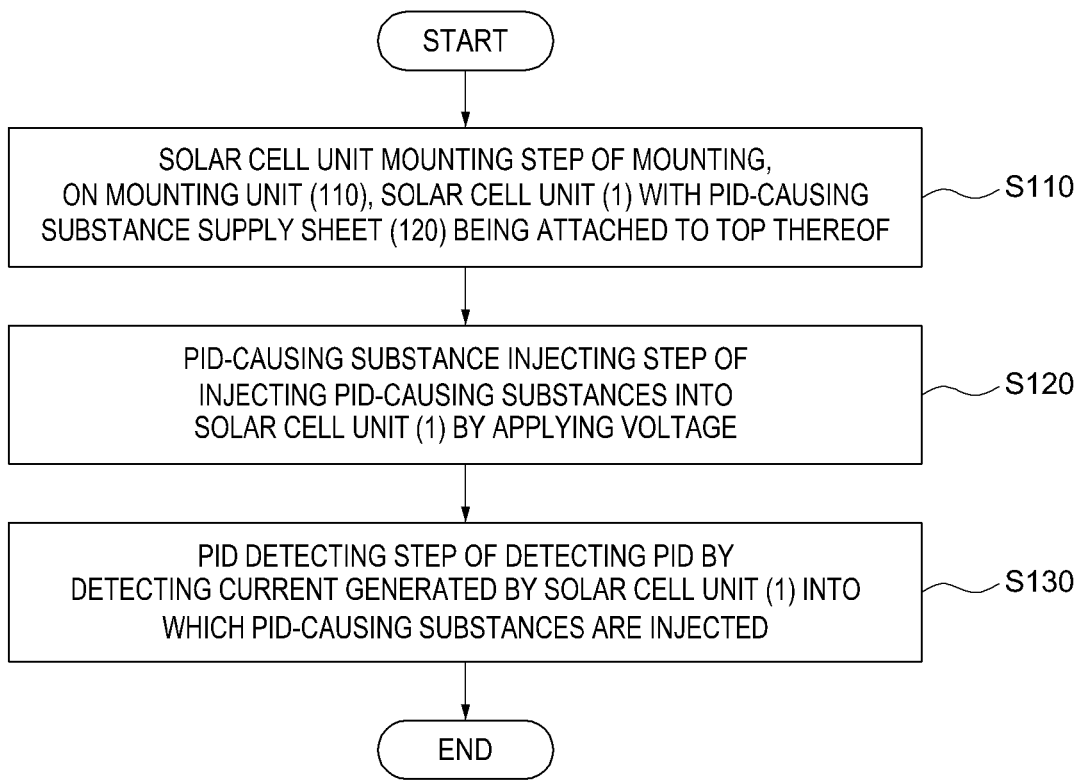
FIG. 8 is a flowchart showing a processing procedure of a method of a PID test which is carried out by supplying PID-causing substances by using a PID test sheet 120 in another embodiment, according to the present invention.

FIG. 8 is a flowchart showing a processing procedure of a method of a PID test which is carried out by supplying PID-causing substances by using the PID test sheet 120 in another embodiment, according to the present invention.

As shown in FIG. 8, the method of a PID test carried out by supplying the PID-causing substances by the PID-causing substance supply unit 140 is performed by the potential induced degradation test apparatus for a solar cell which is configured to include the PID test chamber 101, the mounting unit 110, the PID test sheet 120, the heating unit 130, the voltage applying unit 150, and the PID measuring unit 160, and the method can be configured to include a solar cell unit mounting step S110, a PID-causing substance supplying step S120, and a PID detecting step S130.

Of the steps, in the solar cell unit mounting step S110, the solar cell unit 1, to which the PID test sheet 120 is attached at the top surface thereof, is mounted at the top of the lower support plate 111, the solar cell unit being configured of any one of a solar cell or a coupled body of the solar cell and one or more of an encapsulant, a back-sheet, a sealing material, or glass. Besides, the load unit 103 for applying a load is mounted at a top of the solar cell unit 1 or the PID test sheet 120. Subsequently, a vacuum negative pressure by the vacuum channel 112, the vacuum holes 113, and the vacuum tube 114 formed in the lower support plate 111 causes the underside of the solar cell unit 1 to come into vacuum-suction contact with the top surface of the lower support plate 111 so as to achieve ohmic contact therebetween.

Next, in the a PID-causing substance supplying step S115, the PID-causing supply unit 140 vaporizes and gasifies the PID-causing substances such as Na and then supplies the PId-causing substances into the inside of the PID test chamber.

Next, in the PID-causing substance injecting step S120, the voltage applying unit 150 applies a voltage for the PID test to the upper voltage terminal 106 of the load unit 103 and the lower voltage terminal 115 of the lower support plate 111 of the mounting unit 110 such that the PID-causing substances of the PID test sheet 120 are guided to be injected into the inside of the solar cell.

Subsequently, in the PID detecting step S130, the PID measuring unit 160 analyzes the PID, after measuring the PID analyzing signal of a leakage current or a current-voltage or electric power output from the solar cell unit 1 contaminated with the PID-causing substances by a simulation of a contaminated state with the PID-causing substances.

The method of a PID test for a solar cell in FIG. 8 described above has the following technical features. The solar cell unit is configured of any one of a solar cell or a coupled body of the solar cell and one or more of an encapsulant, a back-sheet, a sealing material, or glass, thereby, having a configuration in which the encapsulant and individual glass configurational members are independent from or coupled to each other from a unit of a cell, and thus it is possible to carry out the PID test by using solid PID-causing substances in a state where the encapsulant and the individual glass configurational members are independent from or are coupled to each other from the unit of the cell by adjusting an amount of the PID-causing substances such an amount of solid Na of the PID test sheet 120.

Figure 9:
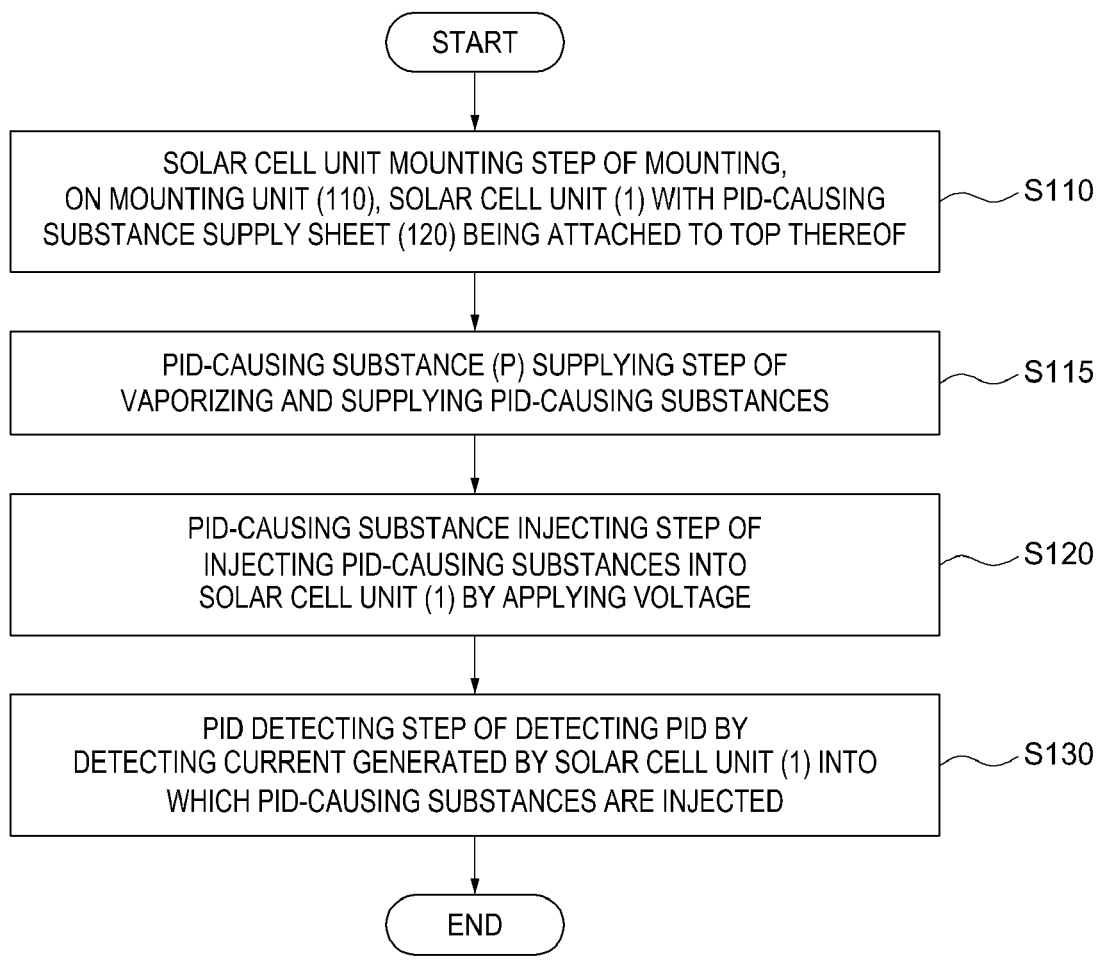
FIG. 9 is a flowchart showing a processing procedure of a method of a PID test which is carried out by supplying PID-causing substances by using the PID test sheet 120 and the PID-causing substance supply unit 140 in still another embodiment, according to the present invention.

FIG. 9 is a flowchart showing a processing procedure of a method of a PID test which is carried out by supplying PID-causing substances by using the PID test sheet 120 and the PID-causing substance supply unit 140 in still another embodiment, according to the present invention.

As shown in FIG. 9, the method of a PID test carried out by supplying solid and gaseous PID-causing substances by using the PID test sheet 120 and the PID-causing substance supply unit 140 is performed by the potential induced degradation test apparatus for a solar cell which is configured to include the PID test chamber 101, the mounting unit 110, the PID test sheet 120, the heating unit 130, the PID-causing substance supply unit 140, the voltage applying unit 150, and the PID measuring unit 160, and the method can be configured to include the solar cell unit mounting step S110, a PID-causing substance supplying step S115, the PID-causing substance injecting step S120, and the PID detecting step S130.

Of the steps, in the solar cell unit mounting step S110, the solar cell unit 1, to which the PID test sheet 120 is attached at the top surface thereof, is mounted at the top of the lower support plate 111, the solar cell unit being configured of any one of a solar cell or a coupled body of the solar cell and one or more of an encapsulant, a back-sheet, a sealing material, or glass. Besides, the load unit 103 for applying a load is mounted at the top of the solar cell unit 1 or the PID test sheet 120. Subsequently, a vacuum negative pressure by the vacuum channel 112, the vacuum holes 113, and the vacuum tube 114 formed in the lower support plate 111 causes the underside of the solar cell unit 1 to come into vacuum-suction contact with the top surface of the lower support plate 111 so as to achieve ohmic contact therebetween.

Next, in the PID-causing substance supplying step S115, the PID-causing substance supply unit 140 vaporizes and gasifies the PID-causing substances such as Na and then supplies the PID-causing substances into the inside of the PID test chamber 101.

Subsequently, in the PID-causing substance injecting step S120, the voltage applying unit 150 applies a voltage for the PID test to the upper voltage terminal 106 of the load unit 103 and the lower voltage terminal 115 of the lower support plate 111 of the mounting unit 110 such that the solid PID-causing substances and the gaseous PID-causing substances of the PID test sheet 120 are guided to be injected into the inside of the solar cell.

Subsequently, in the PID detecting step S130, the PID measuring unit 160 analyzes the PID, after measuring the PID analyzing signal of a leakage current or a current-voltage or electric power output from the solar cell unit 1 contaminated with the PID-causing substances by a simulation of a contaminated state with the PID-causing substances.

The method of a PID test for a solar cell in FIG. 9 described above has the following technical features. The solar cell unit is configured of any one of a solar cell or a coupled body of the solar cell and one or more of an encapsulant, a back-sheet, a sealing material, or glass, thereby, having a configuration in which the encapsulant and individual glass configurational members are independent from or coupled to each other from a unit of a cell, and thus it is possible to carry out the PID test by using solid and gaseous PID-causing substances in a state where the encapsulant and the individual glass configurational members are independent from or are coupled to each other from the unit of the cell by adjusting an amount of PID-causing substances and the gaseous PID-causing substances such as solid Na and gaseous Na of the PID test sheet 120.

In the PID-causing substance injecting step S120 using the PID test sheet 120 in FIGS. 8 and 9 in the method of a PID test for a solar cell of the present invention, it is possible to carry out different PID tests depending on the PID test sheets 120a, 120b, and 120c having different configurations shown in FIGS. 4 and 5.

First, with reference to FIG. 4, the PID-causing substance injecting step being performed in a case where the PID test sheet 120 is configured of the PID test sheet 120a having the PID-causing substance layer 123 formed under the underside of the polymer resin layer 121 in FIG. 4 is described as follows.

FIG. 4 shows a state where the PID test sheet 120a is in contact with the top surface of the solar cell unit 1 which is a test target. In this case, when the PID-causing substance injecting step S120 is performed, the PID test sheet 120a in FIG. 4 is put on an electric field having a difference in voltage supplied by the voltage applying unit 150, in a state where the PID test sheet is in contact with the solar cell unit 1. Hence, the PID-causing substances of the PID-causing substance layer 123 move to the solar cell unit 1, which is the test target, and are injected into the inside of the solar cell provided in the solar cell unit 1, and thereby the solar cell is contaminated with the PID-causing substances. In other words, as shown in FIG. 4, when a PID test for a solar cell is carried out by using the PID test sheet 120a having the PID-causing substance layer 123 formed under the underside of the polymer resin layer 121, solid PID-causing substances are directly injected into the inside of the solar cell unit 1 (solar cell) such that a PID test for a solar cell contaminated with the PID-causing substances can be carried out.

Then, with reference to FIG. the PID-causing substance injecting step being performed in a case where the PID test sheet 120 is configured of the PID test sheet 120b in FIG. 5 which has the polymer resin layer 121 that comes into contact with the top surface of the solar cell unit 1 and the PID-causing substance layer 123 that is formed to be stacked on the top surface of the polymer resin layer 121 so as to supply the PID-causing substances P to the solar cell via the polymer resin layer is described as follows.

FIG. 5 shows a state where the PID test sheet 120b is in contact with the top surface of the solar cell unit 1 which is the test target. In other words, the PID test sheet 120b is in contact with the solar cell unit 1 which is the test target with the PID-causing substance layer 123 for a solar cell interposed therebetween in FIG. 4; however, the PID test sheet 120b comes into contact with the solar cell unit 1, which is the test target, with the polymer resin layer 121 interposed therebetween in FIG. 5. In this case, when the PID-causing substance injecting step S120 is performed, the PID test sheet 120b in FIG. 5 is put on an electric field having a difference in voltage supplied by the voltage applying unit 150, in a state where the PID test sheet is in contact with the solar cell unit 1. Hence, the PID-causing substances of the PID-causing substance layer 123 move to the solar cell unit (solar cell) 1, which is the test target, via the polymer resin layer 121 and are injected into the inside of the solar cell, and thereby the solar cell is contaminated with the PID-causing substances. In other words, as shown in FIG. 5, when a PID test for a solar cell is carried out by using the PID test sheet 120b having the PID-causing substance layer 123 formed on the top surface of the polymer resin layer 121, a PID test for a solar cell in a case where the encapsulant is contaminated with the solid PID-causing substances can be carried out. In other words, in a case of FIG. 5, the PID-causing substances of a solar cell moves to the solar cell unit 1, which is the test target, through the polymer resin layer 121, and thus a longer time is taken for the PID-causing substance of a solar cell to reach the solar cell unit 1, which is the test target, than that in FIG. 4, and a reaching probability decreases. However, positive ions contained in cover glass move to a solar cell through an encapsulant in a solar cell module, and thus it is possible to achieve an environmental condition similar to that in a solar cell module configured as shown in FIG. 5 such that it is possible obtain a more accurate result of the PID test.

Then, with reference to FIG. 6, the PID-causing substance injecting step being performed in a case where the PID test sheet 120 is configured of the PID test sheet 120c in FIG. 6 which has the polymer resin layer 121 that comes into contact with the top surface of the solar cell unit 1 and the PID-causing substances P that are injected into the inside of the polymer resin layer 121 an move through the inside of the polymer resin layer so as to be injected into the solar cell is described as follows.

FIG. 6 shows a state where the PID test sheet 120c is in contact with the top surface of the solar cell unit 1, which is the test target. In other words, the PID test sheet 120c is in contact with the solar cell unit, 1 which is the test target, with the PID-causing substance layer 123 for a solar cell interposed therebetween in FIG. 4; however, the PID test sheet 120c containing the PID-causing substances P mixed inside directly comes into contact with the solar cell unit 1, which is the test target in FIG. 6. In this case, when the PID-causing substance injecting step S120 is performed, the PID test sheet 120c in FIG. 6 is put on an electric field having a difference in voltage supplied by the voltage applying unit 150, in a state where the PID test sheet is in contact with the solar cell unit 1. Hence, the PID-causing substances P, P1, and P2 in the inside of the polymer resin layer 121 move from the inside of the polymer resin layer 121 to the solar cell unit (solar cell) 1, which is the test target, and is injected into the inside of the solar cell, and thereby the solar cell is contaminated with the PID-causing substances. In other words, in a case of the PID test for a solar cell by using the PID test sheet 120c in FIG. 6, the PID-causing substances P1 and P2 are uniformly dispersed inside the polymer resin layer 121. When two different particles of PID-causing particles of a solar cell which move to the solar cell unit 1, which is the test target, are referred to as a first PID-causing substance (particle) P1 and a second PID-causing substance (particle) P2, the following description is provided. The first PID-causing substance P1 has a longer distance to the solar cell unit 1, which is the test target, than the second PID-causing substance P2 has. When the PID-causing substances of a solar cell are assumed to be the same particles, the first PID-causing substance P1 has the same moving distance as the second PID-causing substance P2 to the solar cell unit 1, which is the test target, for the same time. Consequently, a moving distance of the first PID-causing substance P1 in the solar cell unit 1, which is the test target, is shorter than that of the second PID-causing substance P2. When the PID-causing substance P2 of a solar cell in the PID test sheet 120c has a relatively long distance to the solar cell unit 1, the PID-causing substance P2 may not reach the solar cell unit 1, which is the test target. As shown in FIG. 4, when the PID-causing substances are in direct contact with the solar cell unit 1, which is the test target, the moving distance is not limited; however, as shown in FIG. 6, when the PID-causing substances are dispersed in the polymer resin layer 121, the PID-causing substances has different distances to the solar cell unit 1, which is the test target, and can or cannot cause PID from the solar cell unit 1 which is the test target. Consequently, in a case of the embodiment, a longer time is taken to achieve degradation effect of a solar cell which is similar to that by the PID-causing substances of a solar cell in FIG. 4; however, the positive ions contained in the cover glass in the solar cell module are dispersed on the whole, and thus it is possible to achieve an environmental condition similar to that in the solar cell module configured as shown in FIG. 6 such that it is possible obtain a more accurate result of the PID test in the configuration shown in FIG. 6.

In the methods of a PID test in the related art, a solar cell module having a large area in which configurational members of the solar cell module are completed through a modularizing process is used or a shape of a module needs to be formed in order of the solar cell, the encapsulant, and glass, and thus it is not possible to analyze a test of a selective PID factor of configurational members of the solar cell module; however, according to the embodiments of the present invention, it is possible to quantify durability against the PID phenomenon from individual configurational members by separating the solar cell, the encapsulant, the backsheet, or the like from each other.

In addition, according to the present invention, it is possible to quantify a level of a cell and durability against the PID of individual configurational members such as the encapsulant of the solar cell module by the method of directly applying solid Na and vaporized Na ions quantified by minimum cell unit in a method in which large-area modularization of the solar cell module is not performed.

The description of the present invention described above is provided as an example, and a person of ordinary skill in the art to which the present invention belongs can understand that it is possible to easily modify the present invention to another embodiment without altering the technical idea or essential feature of the present invention. Therefore, the embodiments described above need to be understood as exemplified examples in every aspect and not as examples limiting the invention. For example, the configurational elements described in singular forms can be realized in a distributed manner. Similarly, the configurational elements described in the distributed manner may be realized in a combined manner.

The scope of the present invention needs to be construed by the claims below, and meaning and the scope of the claims and every modified or altered embodiment derived from an equivalent concept of the claims need to be construed to belong to the scope of the present invention.

REFERENCE SIGNS LIST

1 SOLAR CELL UNIT
100 POTENTIAL INDUCED DEGRADATION TEST APPARATUS
101 PID TEST CHAMBER
103 LOAD UNIT
104 WEIGHT
105 WEIGHT FIXING ROD
106 UPPER VOLTAGE TERMINAL
110 MOUNTING UNIT
111 LOWER SUPPORT PLATE
112 VACUUM CHANNEL
113 VACUUM HOLE
114 VACUUM TUBE
115 LOWER VOLTAGE TERMINAL
120 PID TEST SHEET
121 POLYMER RESIN LAYER
123 PID-CAUSING SUBSTANCE LAYER
130 HEATING UNIT
130a HOT PLATE
140 CONTAMINANT SUPPLYING UNIT
P PID-CAUSING SUBSTANCE
P1 FIRST PID-CAUSING SUBSTANCE
P2 SECOND PID-CAUSING SUBSTANCE
150 VOLTAGE APPLYING UNIT
160 PID MEASURING UNIT

What is claimed is:

1. A potential induced degradation test apparatus for a solar cell, comprising:
a potential induced degradation (PID) test chamber;
a mounting unit which is disposed inside the PID test chamber, wherein a solar cell unit as a PID test target is seated at the mounting unit to carry out a PID test;
a PID supply means including a PID test sheet or a PID-causing substance supply unit, the PID test sheet being attached on a top of the solar cell unit so as to supply PID-causing substances to a solar cell of the solar cell unit and being seated together with the solar cell unit at the mounting unit, and the PID-causing substance supply unit supplying the PID-causing substances into an inside of the PID test chamber;
a heating unit which is disposed below the mounting unit so as to heat the solar cell unit seated at the mounting unit for the PID test;
a voltage applying unit which is configured to apply a PID test voltage to a top surface and an underside of the solar cell unit seated at the mounting unit; and
a PID measuring unit which is configured to detect a current generated at the solar cell of the solar cell unit and detect PID.

2. The potential induced degradation test apparatus according to claim 1,
wherein the mounting unit has a lower support plate at which the solar cell unit is seated and which is formed by a conductive metal plate including:
a vacuum channel formed to have a vacuum pressure as an internal pressure,
one or more vacuum holes formed to penetrate a top surface of the lower support plate at a position of the vacuum channel, and
a vacuum tube which applies a negative pressure for vacuum to the vacuum channel.

3. The potential induced degradation test apparatus according to claim 1,
wherein the PID test sheet includes:
a polymer resin layer, and
a PID-causing substance layer which comes into contact with the top surface of the solar cell unit and is formed to be stacked under an underside of the polymer resin layer so as to supply the PID-causing substances to the solar cell.

4. The potential induced degradation test apparatus according to claim 1,
wherein the PID test sheet includes:
a polymer resin layer which comes into contact with the top surface of the solar cell unit, and
a PID-causing substance layer which is formed to be stacked on a top surface of the polymer resin layer so as to supply the PID-causing substances to the solar cell via the polymer resin layer.

5. The potential induced degradation test apparatus according to claim 1,
wherein the PID test sheet includes:
a polymer resin layer which comes into contact with the top surface of the solar cell unit, and
PID-causing substances which are injected into an inside of the polymer resin layer and move through the inside of the polymer resin layer so as to be injected into the solar cell.

6. The potential induced degradation test apparatus according to claim 1,
wherein the PID-causing substances are Na ions.

7. The potential induced degradation test apparatus for the solar cell according to claim 1,
wherein the PID-causing substance supply unit includes an Na vaporizer which vaporizes Na and supplies an Na gas into an inside of the PID test chamber.

8. The potential induced degradation test apparatus according to claim 1, further comprising:
a load unit that includes,
weights, and
a weight fixing rod which has an upper voltage terminal formed at an upper side of the weight fixing rod and on which the weights are mounted.

9. A method of a potential induced degradation test for a solar cell, the method being carried out by a potential induced degradation test apparatus which includes a potential induced degradation (PID) test chamber, a mounting unit, a heating unit disposed below the mounting unit so as to heat a solar cell unit seated at the mounting unit for a PID test, one or more PID supply means including a PID-causing substance supply unit or a PID test sheet, a voltage applying unit, and a PID measuring unit, the method comprising:
mounting, on the mounting unit, the solar cell unit with the PID test sheet which is attached to a top surface thereof or the solar cell unit to which the PID test sheet is not attached;
injecting, into the solar cell of the solar cell unit, a PID-causing substance gas supplied into an inside of the PID test chamber by applying a voltage to the mounting unit and vaporizing PID-causing substances in the PID test sheet or vaporizing PID-causing substances by the PID-causing substance supply unit; and
detecting PID by measuring a leakage current of the solar cell unit to which a voltage is applied and into which the PID-causing substances are injected.

10. The method of the potential induced degradation test according to claim 9,
wherein the mounted solar cell unit is a solar cell or a coupled body of the solar cell and one or more of an encapsulant, a back-sheet, a sealing material, or glass.

11. The method of the potential induced degradation test according to claim 9,
wherein the mounting unit is formed by a conductive metal plate including:
a vacuum channel formed to have a vacuum pressure as an internal pressure in the lower support plate,
one or more vacuum holes formed to penetrate a top surface of the lower support plate at a position of the vacuum channel, and
a vacuum tube which applies a negative pressure for vacuum to the vacuum channel, and
wherein the solar cell unit comes into close contact with a top of the lower support plate by vacuum suction in order to improve a fixing force and conductivity.

12. The method of the potential induced degradation test according to claim 9,
wherein the PID-causing substances injected into the solar cell are Na ions.

13. The method of the potential induced degradation test according to claim 9,
wherein the injecting of the PID-causing substance gas includes injecting the PID-causing substances into the solar cell by the PID test sheet having a polymer resin layer and a PID-causing substance layer which comes into contact with the top surface of the solar cell unit and is formed to be stacked under an underside of the polymer resin layer so as to supply the PID-causing substances to the solar cell, in order to carry out the PID test for a case where the PID-causing substances are directly injected into the solar cell.

14. The method of the potential induced degradation test according to claim 9,
wherein the injecting of the PID-causing substance gas includes injecting the PID-causing substances into the solar cell by the PID test sheet having a polymer resin layer which comes into contact with the top surface of the solar cell unit and a PID-causing substance layer which is formed to be stacked on a top surface of the polymer resin layer so as to supply the PID-causing substances to the solar cell via the polymer resin layer, in order to carry out the PID test for a case where the PID-causing substances are injected into the solar cell via an encapsulant corresponding to the polymer resin layer.

15. The method of the potential induced degradation test according to claim 9,
wherein the injecting of the PID-causing substance gas includes injecting the PID-causing substances into the solar cell by the PID test sheet having a polymer resin layer which comes into contact with the top surface of the solar cell unit and the PID-causing substances which are dispersed and injected into an inside of the polymer resin layer such that the PID-causing substances are supplied to the solar cell via the polymer resin layer, in order to carry out the PID test for a case where an encapsulant corresponding to the polymer resin layer is contaminated with the PID-causing substances.

* * * * *